(12) United States Patent
Andresen et al.

(10) Patent No.: US 9,071,132 B2
(45) Date of Patent: Jun. 30, 2015

(54) DECOMPOSITION AND MITIGATION OF A DISTURBANCE BEING PRESENT AT AN ELECTRIC CONNECTION BETWEEN AN ELECTRIC POWER GENERATING SYSTEM AND A POWER GRID

(75) Inventors: Björn Andresen, Ostbirk (DK); Paul Brian Brogan, Glasgow (GB); Nikolaus Moeller Goldenbaum, Glasgow (GB)

(73) Assignee: SIEMENS AKTIENGESELLSCHAFT, München (DE)

( * ) Notice: Subject to any disclaimer, the term of this patent is extended or adjusted under 35 U.S.C. 154(b) by 201 days.

(21) Appl. No.: 13/879,873

(22) PCT Filed: Feb. 8, 2011

(86) PCT No.: PCT/EP2011/051794
§ 371 (c)(1),
(2), (4) Date: Apr. 17, 2013

(87) PCT Pub. No.: WO2012/052190
PCT Pub. Date: Apr. 26, 2012

(65) Prior Publication Data
US 2014/0152292 A1    Jun. 5, 2014

(30) Foreign Application Priority Data
Oct. 19, 2010    (EP) .................................... 10188028

(51) Int. Cl.
*G01R 29/26* (2006.01)
*G01R 23/20* (2006.01)
(Continued)

(52) U.S. Cl.
CPC ................ *H02M 1/12* (2013.01); *G01R 29/26*
(2013.01); *G01R 29/0814* (2013.01); *G01R 23/20* (2013.01); *G01R 31/40* (2013.01); *G01R 19/00* (2013.01)

(58) Field of Classification Search
CPC ............... G01R 19/00; G01R 19/0084; G01R 19/0092; G01R 23/20; G01R 31/40; G01R 29/26; G01R 29/0814; H02M 1/12
USPC .............. 324/76.11, 614, 613, 612, 600, 620; 702/69
See application file for complete search history.

(56) References Cited

U.S. PATENT DOCUMENTS

| 4,937,720 A | 6/1990 | Kirchberg |
| 5,508,623 A | 4/1996 | Heydt |

(Continued)

FOREIGN PATENT DOCUMENTS

| CN | 101309012 A | 11/2008 |
| EP | 1995863 A2 | 11/2008 |

(Continued)

*Primary Examiner* — Hoai-An D Nguyen

(57) ABSTRACT

A disturbance on an electric signal at an electric connection between an electric power generating system and a power grid is decomposed into a first disturbance with a first strength assigned to the electric power generating system and a second disturbance with a second strength assigned to the power grid. A voltage value of a voltage of the electric signal is measured. A current value of a current of the electric signal is measured. A value of an open circuit voltage of an equivalent voltage source is calculated based on the measured voltage value, the measured current value and a characteristic equivalent impedance of the electric power generating system so that the electric power generating system is in a harmonic model. The strength of the first disturbance is determined based on the calculated value of the open circuit voltage of the equivalent voltage source.

10 Claims, 2 Drawing Sheets

(51) Int. Cl.
  *H02M 1/12* (2006.01)
  *G01R 29/08* (2006.01)
  *G01R 31/40* (2014.01)
  *G01R 19/00* (2006.01)

(56) References Cited

U.S. PATENT DOCUMENTS 5,567,994 A 10/1996 Davis
6,032,026 A * 2/2000 Seki et al. .............. 455/63.1
6,182,017 B1 * 1/2001 Xu ............................ 702/60
2008/0065337 A1 * 3/2008 Huang et al. .............. 702/66

FOREIGN PATENT DOCUMENTS

| JP | 11174100 A | 7/1999 |
| WO | WO 9716739 A1 | 5/1997 |
| WO | WO 0010017 A1 | 2/2000 |
| WO | WO 2008153419 A2 | 12/2008 |

* cited by examiner

DECOMPOSITION AND MITIGATION OF A DISTURBANCE BEING PRESENT AT AN ELECTRIC CONNECTION BETWEEN AN ELECTRIC POWER GENERATING SYSTEM AND A POWER GRID

CROSS REFERENCE TO RELATED APPLICATIONS

This application is the US National Stage of International Application No. PCT/EP2011/051794 filed Feb. 8, 2011 and claims the benefit thereof. The International Application claims the benefits of European application No. 10188028.4 filed Oct. 19, 2010, both of the applications are incorporated by reference herein in their entirety.

FIELD OF INVENTION

The present invention relates to the technical field of electrically connecting an electric power generating system, in particular a wind turbine or a wind farm comprising a plurality of wind turbines, with a power grid. In particular, the present invention relates to a method for decomposing a disturbance on an electric signal being present at an electric connection between an electric power generating system and a power grid into a first disturbance with a first strength, wherein the first disturbance is assigned to the electric power generating system, and a second disturbance with a second strength, wherein the second disturbance is assigned to the power grid. Further, the present invention relates to a method for mitigating such a disturbance. Furthermore, the present invention relates to a data processing unit, to an electric power generating system and to a computer program, which are all adapted for controlling the above mentioned methods.

ART BACKGROUND

Wind turbines are used to convert wind energy to electrical energy in a clean and efficient way. In a wind turbine a rotor comprising rotor blades drives an electric generator, either directly or by means of a gearbox. The alternating current (AC) frequency that is developed at stator terminals of the electric generator is directly proportional to the speed of rotation of the rotor. The voltage at the stator terminals also varies as a function of the rotational speed of the generator. For an optimum energy capture, this rotational speed varies according to the speed of the wind driving the rotor blades. To limit the energy capture at high wind speeds and to avoid a damage of the rotor, the rotational speed of the electric generator is controlled by altering the pitch angle of the rotor blades.

An adaptation of the variable voltage and frequency of the electric generator to a nominally fixed voltage and frequency of a power grid is typically achieved by a power converter. A power converter typically includes a generator bridge, which in normal operation operates as an active rectifier in order to supply power to a direct current (DC) link. The generator bridge can have any suitable topology with a series of semiconductor power switching devices fully controlled and regulated using a pulse width modulation (PWM) strategy. A power converter typically comprises two network bridges, wherein a first network bridge converts the AC power signal provided by the generator to a DC power signal and a second network bridge converts this DC power signal to an AC power signal, which in voltage, frequency and phase angle is matched to the power grid. Since a power converter always accomplishes a frequency conversion, such power converters are often also denominated as frequency converters.

However, in practice there always exist at least some disturbances on an electric signal being present at an electric power connection line between the wind turbine(s) and the power grid. These disturbances are in particular harmonic disturbances, which may be caused for instance by the switching frequency of a PWM modulated power converter or of passive rectifier bridges, system resonances, arc furnaces . . . etc. However, disturbances are also caused by electric equipment being connected to the power grid. In this respect electric equipment may be any electric system or electric device, which is connected to the power grid. In particular, electric equipment includes electric consumers or user equipment and electric power generating systems such as any type of electric power plant (e.g. one or more wind turbines), which feeds electric energy to the power grid.

It is mentioned that disturbances can also be caused by non-idealities in the power system itself, e.g. saturation in the power system transformers.

The reliability and efficiency of the power grid as well as the connected equipment is strongly dependant on the harmonic distortion in the system voltage of the power grid. Therefore, power grid operators are required to ensure a reliable delivery of power with a quality that meets certain standards to ensure an untroubled operation of any type of electric equipment being connected to the power grid. Therefore grid operators are taking large measures to keep the harmonic distortion within predefined levels. This holds in particular for the harmonic distortion caused by power converters or frequency converters. However, it should be understood that of course all harmonics in the power grid are unwanted and might course problems in the system and/or in connected electric equipment. No distinction is made between how these harmonics are generated.

At present, the main focus related to the handling of the harmonic emission from power converters is directed on the most significant harmonics of a switching frequency, their sidebands and multiples of these sidebands. It is known to suppress these harmonic frequencies by means of special filters, different switching patterns, phase shifting between different switching pattern, etc. Techniques also exist, by which individual harmonics can be cancelled by the application of algorithms to select appropriate PWM switching patterns.

EP 1 995 863 A2 discloses a method for controlling a plurality of power converters that can be used to interface to a supply network or a power grid. Each power converter includes a network bridge operating in accordance with a PWM strategy, which has the same switching period and which causes at least one unwanted harmonic in the voltage of the power grid. The method includes the step of providing the switching period of the PWM strategy of each network bridge with a different time offset relative to a time datum such that the at least one unwanted harmonic in the supply network voltage is at least partially cancelled.

Generally, lower order (frequency) harmonics are not considered as to cause significant distortion problems. However, where problems in connection with lower order harmonics are expected, it is known to use so called park level filters in order encounter such problems. In this respect park level filters are high power filter devices, which suppress certain harmonics in a common electric power output signal being provided by two or more wind turbines or by a whole wind farm or wind park.

For characterizing the harmonic emission from an electric power generating system being connected to a power grid by means of a power converter (or frequency converter), there is typically made the assumption that the electric currents measured at the terminals of the power converter are all generated by the power converter itself. This assumption, which can be seen as a consequence of not taking into account the harmonic disturbances (background harmonics) which are already present in the power grid, has inter alia the drawback, that an active filtering cannot be incorporated in the power converter, because it is presently not possible to distinguish between harmonic disturbances caused by background harmonics within the power grid and harmonic disturbances caused by the power converter.

With an increasing amount of electric power generating systems, in particular wind turbines, being connected to the power grid via power converters, the demand for techniques to control- and/or to analyze the harmonic emission from such electric power devices is becoming increasingly important.

There may be a need for improving the analysis of electric disturbances at the connection between an electric power generating system and a power grid in particular with respect to the origin of the electric disturbances. Further, there may be a need for mitigating such electric disturbances in order to improve the electric quality of a power grid.

SUMMARY OF THE INVENTION

This need may be met by the subject matter according to the independent claims. Advantageous embodiments of the present invention are described by the dependent claims.

According to a first aspect of the invention there is provided a method for decomposing a disturbance on an electric signal being present at an electric connection between an electric power generating system and a power grid into a first disturbance with a first strength, wherein the first disturbance is assigned to the electric power generating system, and a second disturbance with a second strength, wherein the second disturbance is assigned to the power grid. The provided method comprises (a) determining a voltage value of a voltage of the electric signal, (b) determining a current value of a current of the electric signal, (c) calculating a value of an open circuit voltage of an equivalent voltage source characterizing the electric power generating system in a harmonic model of the electric power generating system based on the measured voltage value, on the measured current value and on a characteristic equivalent impedance of the electric power generating system, and (d) determining the strength of the first disturbance based on the calculated value of the open circuit voltage of the equivalent voltage source.

The described method is based on the idea that by representing the electric power generating system with an equivalent voltage source and with a characteristic equivalent impedance the first disturbance, which is assigned to the electric power generating system, and the second disturbance, which is assigned to the power grid, can be determined independently from each other. Specifically, the derived model which is used for separating the two disturbances from each other may contain an ideal internal voltage source (both magnitude and phase) as well as the complex impedance of the electric power generating system which together form the well known Thevenin—or alternatively Norton—representation of the electric power generating system.

In this document the term "electric power generating system" may denote any electric device which is capable of producing electric power. The electric power generating system may not only comprise an electric generator. In particular, the electric power generating system may further comprise electric equipment, which is used for connecting the electric generator to the power grid in a reliable manner. Specifically, the electric equipment may be a power converter respectively a frequency converter, which is used for adapting the AC frequency and the voltage of electric power signal provided by the electric power generating system to the given AC frequency and the given voltage of the power grid.

In particular, the electric power generating system may be a wind turbine. The wind turbine may be for instance a variable speed wind turbine or a doubly fed wind turbine, which has an electric generator with windings on both its stator and its rotor, wherein both windings transfer significant power between the rotating shaft and the electrical system of the wind turbine. Doubly fed wind turbines are useful in applications that require varying speed of the shaft for a fixed AC frequency of the generated power signal.

In this document the term "disturbance" may particularly denote any unwanted signal component, which in frequency and/or in phase differs from the ideal electric signal, which is supposed to be delivered by the electric power generating system to the power grid. In this respect a "disturbance" may comprise a disturbing voltage and/or a disturbing current.

The term being "assigned to" may denote the origin of the respective disturbance. Specifically, the first disturbance may be caused by an (always not perfect) operation of the electric power generating system and the second disturbance may be caused by an (always not perfect) operational state of the power grid.

According to an embodiment of the invention (a) the electric signal comprises at least two frequency components, (b) the determining of the voltage value relates to one of the at least two frequency components, (c) the determining of the current value relates to the one of the at least two frequency components and (d) the characteristic equivalent impedance relates to the one of the at least two frequency components.

In this respect the relation of the voltage value and the current value to the one of the at least two frequency components means that the respective physical variable (voltage value, current value) is determined at this frequency. Correspondingly, the relation of the characteristic equivalent impedance to this frequency means that in case of a frequency dependent impedance an impedance value is taken into account which corresponds to this frequency.

Generally speaking, the electric signal may comprise a distribution of different frequency components. As a consequence, also the physical variables voltage value, current value and impedance may exhibit a frequency distribution, wherein for accomplishing the described method only one frequency component of these physical variables is taken into account.

In this respect it is pointed out that the described method can also be carried out in a multiple way at different frequencies. Thereby, the disturbances within the electric system comprising the electric power generating system, the power grid and the electric connection between the electric power generating system and the power grid can be analyzed in a frequency depending manner.

According to a further embodiment of the invention the first disturbance is a first complex harmonic current and the second disturbance is a second complex harmonic current.

Generally speaking, the described method allows for a separation between (a) the individual complex harmonic currents $I1(n)$ generated by the electric power generating system or any power electronic device being assigned to the electric power generating system and (b) the individual complex harmonic currents $I2(n)$ caused by the back ground harmonics present at the electric connection between an electric power generating system and a power grid. In this way a more accurate electric model representation of the electric power generating system can be formed at each harmonic frequency.

In this respect the term "separation" may particularly mean that the first complex harmonic current I1($n$) and the second complex harmonic current I2($n$) are determined independently from each other.

It is pointed out that the harmonics can be either integer harmonics (n is an integer number) or so called inter-harmonic (n is a non-integer number) with respect to a specific disturbance frequency.

According to a further embodiment of the invention first disturbances are caused by a power converter of the electric power generating system. This may provide the advantage that with the described method a notably strong source of electric disturbances at an electric connection between the electric power generating system and the power grid can be examined.

As has already been mentioned above the power converter, which is often also called a frequency converter, is typically used for adapting the AC frequency of electric power signal provided by the electric power generating system to the given AC frequency of the power grid.

According to a further embodiment of the invention the first disturbances are related to a switching operation of the power converter.

In this respect the first disturbance or the first harmonic current I1($n$) may have a strong frequency component, which corresponds to an integer harmonic frequency of a fundamental frequency of the power converter e.g. caused by the switching operation of the power converter. However, it is again pointed out that with the described method it may also be possible to analyze other frequency components of the first disturbance and the second disturbance, wherein with respect to the fundamental frequency the other frequencies are non-integer harmonics.

According to a further embodiment of the invention the first disturbance comprises a disturbing voltage signal, which is given by the value of the open circuit voltage of the equivalent voltage source characterizing the electric power generating system in the harmonic model. Thereby, calculating the value of the open circuit voltage uses the following formula (1):

$$Upwm(n)=Um(n)+Im(n)\cdot Zchm(n) \qquad (1)$$

Therein, Upwm(n) is the disturbing voltage and the open circuit voltage, Um(n) is the measured voltage value, Im(n) is the measured current value, Zchm(n) is characteristic equivalent impedance of the electric power converter system and n is a parameter value being indicative for the frequency component, at which the strength of the first disturbance is determined. This may provide the advantage that the (strength of the) voltage component of the first disturbance can be determined in an easy and reliable manner.

According to a further embodiment of the invention the first disturbance further comprises a disturbing current signal Ichm(n), which is given by the formula (2):

$$Ichm(n)=Upwm(n)/[Zchm(n)+Zgrid\_f(n)] \qquad (2)$$

Therein, Zgrid_f(n) is a predefined impedance value being assigned to the equivalent impedance of the power grid.

Using the predefined impedance value Zgrid_f(n), which may represent the impedance of a fictitious grid, may provide the advantage that for analyzing the first disturbance special characteristics of the grid, the electric power generating system is actually connected to, can be eliminated. Thereby, harmonic current emissions from different individual electric power generating systems can be directly compared with each other.

According to a further aspect of the invention there is provided a method for mitigating a disturbance on an electric signal being present at an electric connection between an electric power generating system and a power grid, wherein a first disturbance with a first strength is assigned to the electric power generating system, and a second disturbance with a second strength is assigned to the power grid. The provided method comprises (a) determining the strength of the first disturbance by carrying out the above described disturbance decomposition method, (b) deriving a control signal based on the determined strength of the first disturbance and (c) controlling the operation of the electric power generating system in response to the control signal.

The described method is based on the idea that by determining the first disturbance level being assigned to the electric power generating system independently from the second disturbance level being assigned to the power grid, the overall disturbance level at the electric connection between the electric power generating system and the power grid can be significantly reduced by operating the electric power generating system in response to the determined strength of the first disturbance.

By controlling the operation of the electric power generating system harmonic emissions, which contribute to the first disturbance, can be either eliminated completely or can be kept within a certain level. In case of a wind farm wherein at least two electric power generating systems are connected to the power grid via the electric connection, the electric power generating systems can be operated in a coordinative manner, wherein e.g. the electric phase of the individual harmonics caused by each of the electric power generating systems is adjusted such that the individual harmonics mutually delete each other.

According to an embodiment of the invention the electric power generating system comprises a power converter with a control unit, which in response to the control signal controls the operation of the power converter in such a manner, that the first strength of the first disturbance and/or the second strength of the second disturbance are mitigated.

The control unit of the power converter or frequency converter can be for instance a reference signal such as a reference voltage signal and/or a reference current signal. The reference signal can be derived by means of a data processing unit, which at its input receives the determined voltage value and the determined current value and which based on these values derives the described control signal respectively the described reference signal. It is mentioned that in this respect the determined voltage value and the determined current value are the raw sampled values of these two quantities.

According to a further aspect of the invention it is provided a data processing unit for decomposing a disturbance on an electric signal being present at an electric connection between an electric power generating system and a power grid into (a) a first disturbance with a first strength, wherein the first disturbance is assigned to the electric power generating system, and (b) a second disturbance with a second strength, wherein the second disturbance is assigned to the power grid. The described data processing unit is adapted for controlling at least one of the above mentioned methods.

Also the described data processing unit is based on the idea that by representing the electric power generating system with an equivalent voltage source and with a characteristic equivalent impedance the first disturbance, which is assigned to the electric power generating system, and the second disturbance, which is assigned to the power grid, can be determined independently from each other.

It is pointed out that the described data processing unit can also be used for mitigating a disturbance on an electric signal being present at an electric connection between an electric power generating system and a power grid. In order to achieve this, the data processing unit is, if applicable together with a control unit for controlling the operation of the electric power generating system, adapted for controlling the above described disturbance mitigation method. In this case the described data processing unit is based on the idea that by determining the first disturbance level being assigned to the electric power generating system independently from the second disturbance level being assigned to the power grid, the overall disturbance level at the electric connection between the electric power generating system and the power grid can be significantly reduced by operating the electric power generating system in an appropriate manner in response to the determined strength of the first disturbance.

According to a further aspect of the invention it is described an electric power generating system, in particular a wind turbine. The described electric power generating system comprises (a) an electric generator for converting mechanical power into electric power, (b) an electric equipment for connecting the electric generator to an electric connection between the electric power generating system and a power grid, and (c) a data processing unit as set forth in the preceding claim.

The described electric power generating system is based on the idea that the above mentioned data processing unit for decomposing a disturbance on the electric signal being present at the electric connection between an electric power generating system and a power grid can be used in order to effectively evaluate the first strength of the first disturbance being assigned to the electric power generating system separately from the second strength of the second disturbance being assigned to the power grid.

When the first (frequency depending) disturbance, which in this document is denominated with $I1(n)$, and the second (frequency depending) disturbance, which in this document is denominated with $I2(n)$, have been separated, it is possible to control these two quantities independently e.g. by feeding back a control signal to a controller of the electric equipment, which may be in particular a power converter or a frequency converter. This may allow for e.g. controlling the emission of individual harmonics from the electric power generating system respectively the power converter to zero or to a level being smaller than a certain disturbance level. Further, a knowledge of $I1(n)$ and/or $I2(n)$ may also allow for a partially of fully filtering of specific (unwanted) harmonics from the power grid. In particular, the filtering may comprise an active filtering, which is accomplished in response to $I1(n)$ and/or $I2(n)$. Furthermore, by controlling the operation of the power converter or frequency converter, the total disturbance (first disturbance+second disturbance) at the electric connection may be minimized. Generally speaking, by controlling the operation of the power converter or frequency converter in response to $I1(n)$ and/or $I2(n)$, the total harmonic currents at the terminals of the power converter, which are connected with the described electric connection, can be reduced to zero or can be limited to a certain level.

It is pointed out that the data processing unit can be an individual processor for one wind turbine or a processor being used for controlling the operation of at least two wind turbines of a wind farm. In the latter case the data processing unit can be realized by means of or with a central wind farm controller, which is used for coordinating the operation of the plurality of wind turbines of the wind farm.

According to a further aspect of the invention it is described a computer program for decomposing a disturbance on an electric signal being present at an electric connection between an electric power generating system and a power grid into a first disturbance with a first strength, wherein the first disturbance is assigned to the electric power generating system, and a second disturbance with a second strength, wherein the second disturbance is assigned to the power grid. The computer program, when being executed by a data processor, is adapted for controlling and/or for carrying out one of the above described the methods.

As used herein, reference to a computer program is intended to be equivalent to a reference to a program element and/or to a computer readable medium containing instructions for controlling a computer system to coordinate the performance of the above described method.

The computer program may be implemented as computer readable instruction code in any suitable programming language, such as, for example, JAVA, C++, and may be stored on a computer-readable medium (removable disk, volatile or non-volatile memory, embedded memory/processor, etc.). The instruction code is operable to program a computer or any other programmable device to carry out the intended functions. The computer program may be available from a network, such as the World Wide Web, from which it may be downloaded.

The invention may be realized by means of a computer program respectively software. However, the invention may also be realized by means of one or more specific electronic circuits respectively hardware. Furthermore, the invention may also be realized in a hybrid form, i.e. in a combination of software modules and hardware modules.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION

Figure 1:
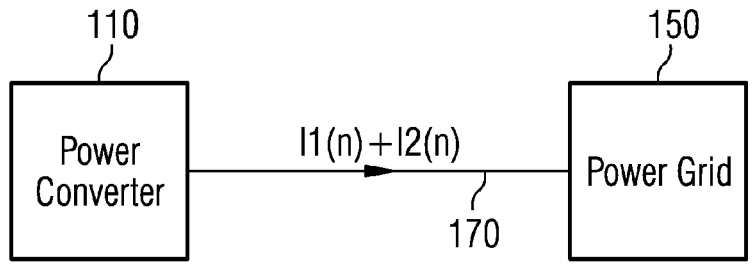
FIG. 1 schematically illustrates a decomposition of a disturbance current into (a) a first disturbance current $I1(n)$ being assigned to a power converter of an electric power generating system and into (b) a second disturbance current $I2(n)$ being assigned to a power grid.

The illustration in the drawing is schematically. It is noted that in different figures, similar or identical elements are provided with the same reference signs or with reference signs, which are different from the corresponding reference signs only within the first digit.

The present invention is especially useful for wind turbine applications on wind turbine level and/or on wind farm level comprising a plurality of wind turbines. However, the present invention can also be used with other electric power setups such as the connection of a solar power plant or a wave energy power plant to a power grid, which plants have also spatially distributed power generating systems and, if applicable power converters respectively frequency converters for connecting the power generating systems to the power grid.

FIG. 1 schematically illustrates a decomposition of a disturbance current into (a) a first disturbance current I1($n$) being assigned to a power converter 110 and into (b) a second disturbance current I2($n$) being assigned to a power grid 150. According to the embodiment described here the power converter 110 is a part of a not depicted electric power generating system such as a wind turbine. The power converter 110 is connected to the power grid 150 by means of an electric connection line 170.

As will be elucidated below in more detail, the decomposition of the disturbance current, which in this document is also denominated harmonic current, can be accomplished by employing a harmonic model. After decomposing or separating I1($n$) and I2($n$) it will be possible to control these two quantities independently from each other. Such a control can be realized in particular by feeding back a control signal to a current- or voltage controller (not shown in FIG. 1) of the power converter 110. This may allow e.g. for:
(A) Controlling the emission of individual harmonics from the power converter 110 to zero or within a certain level.
(B) Partially or fully filtering specific harmonics from the power grid 150.
(C) Controlling the total harmonic currents at the terminals of the power converter 110 to zero or to stay within a certain level.

Figure 2:
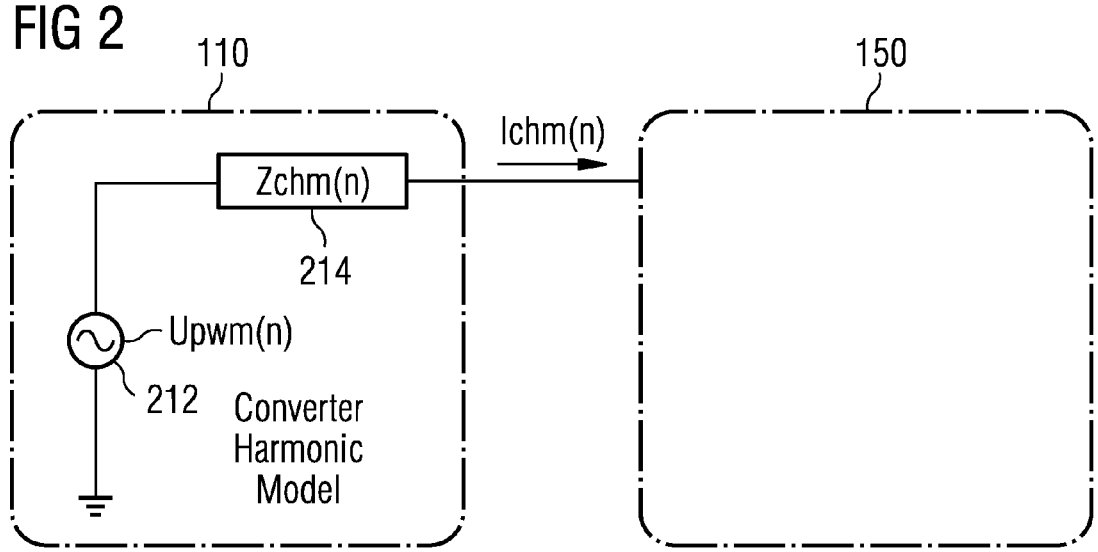
FIG. 2 illustrates a harmonic model of a power converter, which is represented as a Thevenin equivalent circuit for each harmonic order n of interest.

FIG. 2 illustrates a harmonic model of the power converter 110, which is represented as a Thevenin equivalent circuit for each harmonic order interest. The harmonic order interest is denoted by "n". It is pointed out that "n" can be either an integer number or a non integer number. The Thevenin equivalent circuit for the power converter 110 comprises an equivalent voltage source 212 and a characteristic impedance 214. In FIG. 2 the open circuit voltage for $n^{th}$ harmonic is denominated with Upwm(n), the characteristic impedance value of the power converter 110 for the $n^{th}$ harmonic is denominated with Zchm(n) and the harmonic current emitted from the power converter 110 for $n^{th}$ harmonic is denominated with Ichm(n).

The harmonic model represents the power converter 110 being used in an electric power generating system such as a wind turbine as a number of equivalent Thevenin circuits, each representing the harmonic emission and reaction to background harmonics of the power grid 150 at a single harmonic frequency n. In this document the harmonic model being used to describe the power converter 110 is also denominated a converter harmonic model (chm).

It is pointed out that the described harmonic model represents both the passive components (such as inductors, capacitors and resistances, transformer) that are present within a electric power generating system, and also the closed loop impedance of the power converter including the effect of the software control algorithm.

As described above, the harmonic currents measured at the terminals of the power converter 110 are composed by two separate components: Currents which are generated by the power converter (I1($n$)) and currents which are a consequence of the reaction of the power converter 110 to background harmonics in the power grid (I2($n$)). In this respect it is mentioned that the power converter 110 and specifically the characteristic impedance 214 of the power converter 110 will damp unwanted voltage disturbances of the power grid 150. In this respect the presence of the power converter 110 contributes to an improved voltage quality of the power grid 150. Furthermore, the harmonic currents generated by the power converter 110 are determined by the impedance of the power grid. This is illustrated in FIG. 3.

It is pointed out that whether or not the "characteristic impedance" is damping the "unwanted voltage disturbances" depends on the characteristics of this impedance (the control of the converter might act in such way to not damp the harmonics at certain frequencies). The converter harmonic model allows this to be determined as it is inclusive of the closed loop control system.

Figure 3:
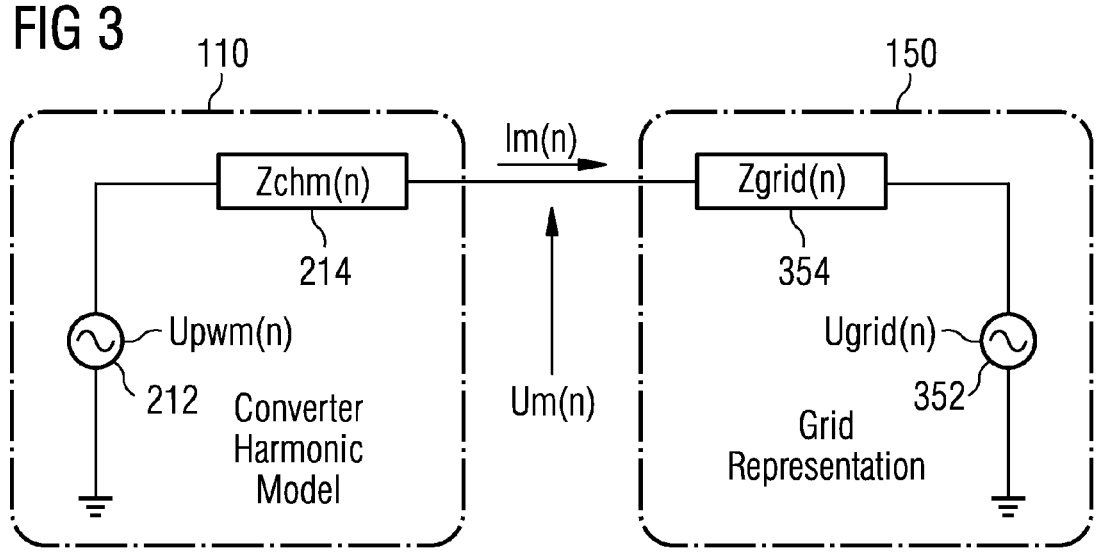
FIG. 3 illustrates the harmonic model of the power converter together with a representation of the power grid.

FIG. 3 illustrates the harmonic model of the power converter 110 together with a representation of the power grid 150. In FIG. 3, Upwm(n) represents the harmonic voltages generated by a Pulse Width Modulation (PWM) switching in the power converter 110, Zchm(n) is again the equivalent impedance 214 of the power converter 110, Zgrid(n) is the impedance 354 of the power grid 150 as seen from the terminals of the power converter 110 and Ugrid(n) represents the open circuit background harmonic voltages 352 in the power grid. Further, Im(n) denominates the individual frequency components of the measured harmonic current at the terminals of power converter 110. Correspondingly, Um(n) denominates the individual frequency components of the measured harmonic voltage at the terminals of power converter 110. In all quantities "n" refers to the harmonic order which can be either integer or non integer.

In order to analyze the emission of harmonic currents from the power converter 110, the effects of background harmonics of the power grid 150, as well as the influence of the impedance of the power grid 150, have to be eliminated from the results. This can be achieved by two simple calculation steps (step 1 and step 2) in the evaluation of the converter harmonic model. It is mentioned that alternatively it is also possible to derive the converter harmonic model by identifying the model parameters from the individual frequency components Um(n) of the measured harmonic voltage and the individual frequency components Im(n) of the measured current by means of appropriate identification algorithms.

Step 1

Calculation of Harmonic Voltage Upwm(n)

The harmonic voltages generated by the power converter 110 (open circuit voltages Upwm(n)) are derived from the measured harmonic currents Im(n) and the measured harmonic voltages Um(n) together with the internal impedance 214 of the power converter 110. This is illustrated in FIG. 4.

Figure 4:
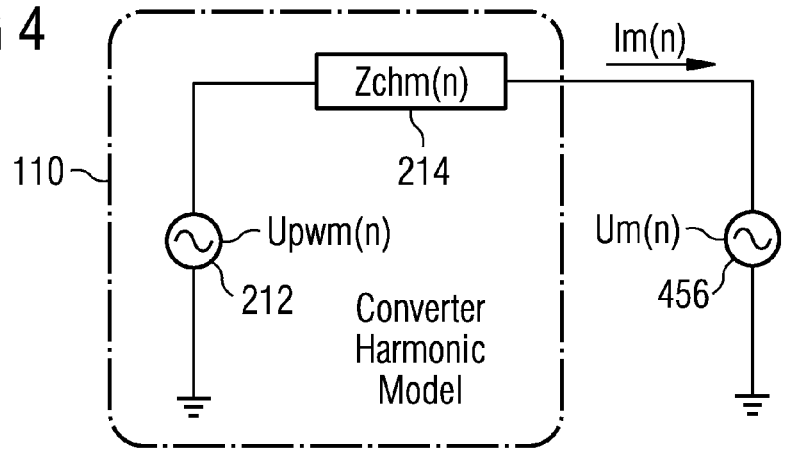
FIG. 4 illustrates a setup for the calculation of the harmonic voltages Upwm(n) provided by the power converter.

FIG. 4 illustrates a setup for the calculation of the harmonic voltages Upwm(n) provided by the power converter 110. Reference numeral 456 denominates a fictitious measurement unit for measuring the harmonic voltages Um(n).

The open circuit voltages Upwm(n) of the power converter 110 is given by:

$$Upwm(n)=Um(n)+Im(n)\cdot Zchm(n)$$

In the derivation of Upwm(n) the internal impedance 214 of the power converter 110 is taken as known. The correctness of this impedance 214 can be verified e.g. by lab measurements or by measurements under different grid conditions e.g. by measuring on different electric power generating systems.

Step 2

Calculation of Harmonic Current Ichm(n)

In the following the calculation of harmonic currents Ichm(n) is described with reference to FIG. 5 which illustrates a setup for the calculation of harmonic currents Ichm(n) provided by the power converter 110.

When the open circuit voltage Upwm(n) and the total impedance Zchm(n)+Zgrid(n) are known, the harmonic current emission from the power converter 110 can be derived. As it is desirable to remove the individual characteristics of the power grid from the obtained results, the impedance Zgrid(n) is replaced by a fictitious impedance Zgrid_f(n) of a fictitious grid 550 having a characteristic impedance. In FIG. 5, the fictitious impedance Zgrid_f(n) is denominated with reference numeral 554. Replacing the impedance Zgrid(n) with the fictitious impedance Zgrid_f(n) may provide the advantage that harmonic current emissions from different power converters 110, which are assigned to different electric power generating systems (e.g. wind turbines) can be directly compared with each other.

Figure 5:
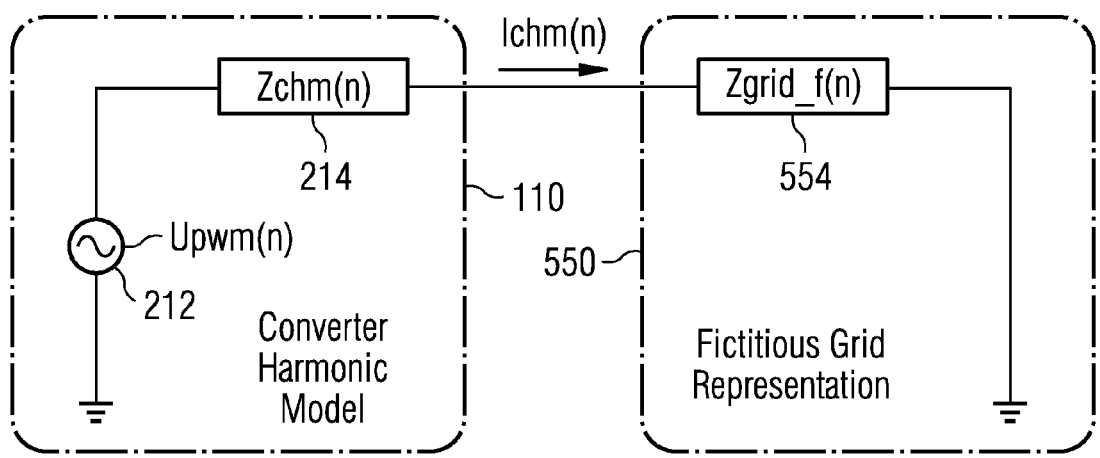
FIG. 5 illustrates a setup for the calculation of harmonic currents Ipwm(n) provided by the power converter.

From the circuit presented in FIG. 5, the harmonic current emission from the turbine can be calculated by the following formula:

$$Ichm(n)=Upwm(n)/[Zchm(n)+Zgrid\_f(n)]$$

An independent control of $I1(n)$ and $I2(n)$ can be realized by the following procedure:

The derived complex internal electric sources—this being either Uchm in the Thevenin representation shown above, or equivalently a current source obtained by transforming the Thevenin equivalent into a Norton equivalent—can be fed back to an appropriate reference signal for a control unit of the power converter. By operating in response to such a reference signal the power converter 110 will be able to either eliminate its harmonic emission, to keep the emission to within a certain level and/or to alter the phase of the individual harmonics in order to cancel out harmonics between adjacent power converters of a superordinate system (e.g. a wind farm) comprising a plurality of electric power generating systems (e.g. wind turbines).

Figure 6:
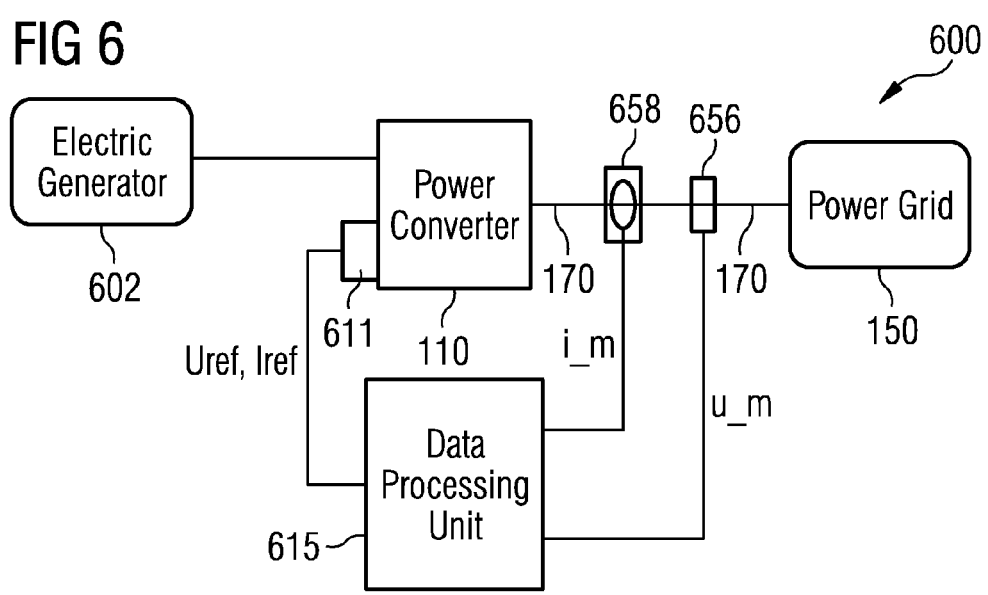
FIG. 6 illustrates an electric power generating system being connected to a power grid via a electric connection, wherein in response to a voltage value Um(n) and a current value Im(n) at the electric connection the operation of a power converter of the electric power generating system is controlled in such a manner that the sum of harmonic currents I1($n$) emitted by the power converter and harmonic currents I2($n$) caused by background harmonics of the power grid is minimized.

A possible setup for such a control procedure is illustrated in FIG. 6. FIG. 6 shows an electric power generating system 600 being connected to a power grid 150 via an electric connection line 170. The electric power generating system 600 comprises (a) a power converter 110, (b) an electric generator 602 for converting mechanical power into electric power, (c) a measurement unit 656 for measuring a raw current signal i_m, (d) a measurement unit 658 for measuring a raw voltage signal u_m, (e) a data processing unit 615 and (f) a control unit 611 for a PWM modulation of the power converter 110.

According to the embodiment described here the raw measured current i_m and the raw measured voltage u_m are both fed to the data processing unit 615 in which the individual harmonics of interest Im(n) and Um(n), respectively, are calculated and applied together with the known internal impedance of the power converter 110, Zchm, to derive the individual internal harmonic electric sources Upwm(n) and Ichm(n) (see FIG. 5). These derived harmonic electric sources are then collected in either a voltage reference value Uref and/or a current reference value Iref. This/These reference values are then added to a reference signal for the control unit 611 which controls the operation of the power converter 110. According to the embodiment described here in response to the voltage reference value Uref and/or the current reference value Iref the control unit 611 controls the operation of the power converter 110 in such a manner that the sum of harmonic currents $I1(n)$ emitted by the power converter 110 and harmonic currents $I2(n)$ caused by background harmonics of the power grid 150 is minimized.

The separation of the harmonics into $I1(n)$ and $I2(n)$ reveals in particular the following advantages:

(A) More accurate characterization of the harmonics emitted from an electric power generating system comprising a power electric device such as e.g. a power/frequency converter.

(B) Possibility for obtaining desired characteristics, e.g. cancellation of the harmonics generated by a power electric device such as a power/frequency converter by feeding back a derived harmonic source to the appropriate reference for controlling the operation of the power electric device thereby eliminating the harmonic source.

(C) It is possible to design the correct size of filter equipment on a wind turbine level or a wind farm level without over or under dimensioning the filter equipment.

(D) Correct and very precise representation of the power/frequency converter including the control system and the connected impedances in relation to background harmonics of a power grid.

(E) The separation of the harmonics into $I1(n)$ and $I2(n)$ can be used for measurement purposes, where it is not possible to connect the power electric device generating the harmonics to a power grid (without disturbances). This allows for a reliable comparison between different power electric devices, which may be fabricated by different production companies.

(F) Possibility to change a phase angle of individual harmonics in such way that they will interfere destructively with the corresponding individual harmonics from at least one other power electric device or power/frequency converter.

It should be noted that the term "comprising" does not exclude other elements or steps and the use of articles "a" or "an" does not exclude a plurality. Also elements described in association with different embodiments may be combined. It should also be noted that reference signs in the claims should not be construed as limiting the scope of the claims.

LIST OF REFERENCE SIGNS 110 power converter/frequency converter
150 power grid
170 electric connection line
212 equivalent voltage source of power converter
214 characteristic impedance of power converter
352 equivalent voltage source of power grid/open circuit background harmonic voltages
354 characteristic impedance of power grid
456 measurement unit for measuring a voltage value of $n^{th}$ harmonic
550 fictitious power grid
554 characteristic impedance of fictitious power grid
600 electric power generating system
602 electric generator
611 control unit for PWM modulation of power converter
615 data processing unit
656 measurement unit for measuring raw voltage
658 measurement unit for measuring raw current
I1(n) harmonic current caused by power converter for $n^{th}$ harmonic
I2(n) harmonic current caused by power grid for $n^{th}$ harmonic
Upwm(n) open circuit voltage for $n^{th}$ harmonic
Zchm(n) characteristic impedance value of power converter for $n^{th}$ harmonic
Ichm(n) harmonic current from power converter for $n^{th}$ harmonic
Im(n) measured current value of $n^{th}$ harmonic
Um(n) measured voltage value of $n^{th}$ harmonic
Uref voltage reference value
Iref current reference value
i_m raw signal of current
u_m raw signal of voltage

The invention claimed is:

1. A method for mitigating a disturbance on an electric signal presented at an electric connection between an electric power generating system including a power converter and a power grid, wherein a first disturbance with a first strength is associated with the electric power generating system and a second disturbance with a second strength is associated with the power grid, comprising:
    determining the strength of the first disturbance,
    deriving a control signal based on the determined strength of the first disturbance, and
    controlling the operation of the electric power generating system in response to the control signal in such a manner that the sum of harmonic currents emitted by the power converter and harmonic currents caused by background harmonics of the power grid is minimized,
    wherein determining the strength of the first disturbance comprises:
        determining a voltage value of a voltage of the electric signal;
        determining a current value of a current of the electric signal;
        calculating a value of an open circuit voltage of an equivalent voltage source based on the determined voltage value, the determined current value, and a characteristic equivalent impedance of the electric power generating system so that the electric power generating system is in a harmonic model; and
        determining the strength of the first disturbance based on the calculated value of the open circuit voltage of the equivalent voltage source.

2. The method as claimed in claim 1, wherein the electric signal comprises at least two frequency components, wherein the voltage value is determined based on one of the at least two frequency components, and wherein the current value and the characteristic equivalent impedance are determined based on the one of the at least two frequency components.

3. The method as claimed in claim 1, wherein the first disturbance is a first complex harmonic current and the second disturbance is a second complex harmonic current.

4. The method as claimed in claim 1, wherein the first disturbance is caused by a power converter of the electric power generating system.

5. The method as claimed in claim 4, wherein the first disturbance is caused by a switching operation of the power converter.

6. The method as claimed in claim 1, wherein the first disturbance comprises a disturbing voltage signal given by the value of the open circuit voltage, wherein the disturbing voltage signal and the value of the open circuit voltage is calculated by a formula $$Upwm(n)=Um(n)+Im(n)\cdot Zchm(n)$$

wherein:
    Upwm(n) is the disturbing voltage signal and the open circuit voltage,
    Um(n) is the determined voltage value,
    Im(n) is the determined current value,
    Zchm(n) is the characteristic equivalent impedance of the electric power generating system, and
    n is a parameter value indicating a frequency component at which the first strength of the first disturbance is determined.

7. The method as claimed in claim 6, wherein the first disturbance further comprises a disturbing current signal, wherein the disturbing current signal is calculated by a formula:

$$Ichm(n)=Upwm(n)/[Zchm(n)+Zgrid\_f(n)]$$

wherein:
    Ichm(n) is the disturbing current signal, and
    Zgrid_f(n) is a predefined impedance value being assigned to the equivalent impedance of the power grid.

8. The method as claimed in claim 1, wherein the electric power generating system comprises a control unit, which in response to the control signal controls the operation of the power converter so that the first strength of the first disturbance and/or the second strength of the second disturbance are mitigated.

9. An electric power generating system, comprising:
    an electric generator that converts a mechanical power into an electric power;
    an electric equipment that connects the electric generator to an electric connection between the electric power generating system and a power grid; and
    a data processing unit that is configured to perform the method as claimed in claim 1.

10. A data processor for mitigating a disturbance on an electric signal presented at an electric connection between an electric power generating system including a power converter and a power grid, wherein a first disturbance with a first strength is associated with the electric power generating system and a second disturbance with a second strength is associated with the power grid, comprising:
    a computer program that when executed by the data processor causes the data processor to perform the method as claimed in claim 1.

* * * * *